(12) United States Patent
Jeong

(10) Patent No.: US 6,320,443 B1
(45) Date of Patent: Nov. 20, 2001

(54) RC DELAY TIME STABILIZING CIRCUIT

(75) Inventor: Young-Han Jeong, Cheongju (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/377,165

(22) Filed: Aug. 19, 1999

(30) Foreign Application Priority Data

Sep. 22, 1998 (KR) .................................................. 98-39308
Feb. 12, 1999 (KR) .................................................... 99-5030

(51) Int. Cl.[7] .................................................. H03H 11/26
(52) U.S. Cl. ............................................. 327/264; 327/283
(58) Field of Search ...................................... 327/113, 114, 327/118, 263, 264, 268, 283, 392, 393, 394, 395, 396, 397, 262, 290; 326/83, 86, 121; 331/57

(56) References Cited

U.S. PATENT DOCUMENTS

| | | | |
|---|---|---|---|
| 4,063,117 | * 12/1977 | Laugesen et al. | 326/88 |
| 4,617,529 | * 10/1986 | Suzuki | 331/57 |
| 5,068,553 | * 11/1991 | Love | 327/262 |
| 5,654,981 | * 8/1997 | Mahant-Shetti et al. | 326/83 |
| 5,734,284 | 3/1998 | Popescu | 327/283 |
| 5,986,463 | * 11/1999 | Takiguchi | 326/27 |
| 6,060,930 | * 5/2000 | Choi | 327/276 |
| 6,097,231 | * 8/2000 | Moscaluk | 327/264 |

* cited by examiner

Primary Examiner—Kenneth B. Wells
Assistant Examiner—Paul Dinh
(74) Attorney, Agent, or Firm—Fleshner & Kim, LLP

(57) ABSTRACT

A RC delay time stabilizing circuit of the present invention includes an inverter which inverts a periodic input signal, a RC delay unit which is charged/discharged in accordance with an output from the inverter, a pull-up MOS transistor connected between a source voltage terminal and an output terminal of the RC delay unit and having a gate for receiving the input signal, and an output unit which generates an output signal having an identical delay time in accordance with output levels of the inverter and the RC delay unit. Such RC delay time stabilizing circuit of the present invention decreases the charging time of the RC delay unit when a periodic signal is inputted, thus being able to maintain the same delay time in each cycle of the input signal.

14 Claims, 2 Drawing Sheets

RC DELAY TIME STABILIZING CIRCUIT

BACKGROUND OF THE INVENTION

1. Field of the Invention

The present invention relates to a resistor-capacitor (RC) delay circuit, and more particularly to a RC delay time stabilizing circuit.

2. Description of the Conventional Art

Generally, a semiconductor memory device controls delay time by using a RC delay circuit which consists of a resistor and a capacitor in order to maintain the time margin of signals. Here, the RC delay circuit charges/discharges an inputted signal to the capacitor through the resistor for thereby delaying the signal.

FIG. 1 illustrates a conventional RC delay circuit.

As shown therein, the conventional RC delay circuit includes an inverter IN1 which inverts an input signal IN, a RC delay unit 10 which delays an output from the inverter IN1 and a NOR gate NR1 which NORs outputs from the inverter IN1 and the RC delay unit 10, the RC delay unit 10 consisting of a resistor R and an n-type MOS capacitor 12.

FIG. 2 shows a signal wave form when an input signal IN having a single cycle is applied. Referring to FIG. 2, in such conventional RC delay circuit, when the input signal IN is inputted through the inverter IN1 and the resistor R to the MOS capacitor 12, the MOS capacitor 12 of the RC delay unit 10 repeatedly performs charging and discharging in accordance with a level of the input signal IN. However, due to the characteristic of the NOR gate NR1, when the input signal IN is transited to a high level from a low level, a delay time d1 of an output signal OUT is determined by an output signal B from the RC delay unit 10, while the delay time d1 thereof is determined by an output signal A from the inverter IN1 when the input signal IN is transited from the high level to the low level. Accordingly, the output signal OUT from the NOR gate NR1 has the delay time by d1 to respect to the input signal IN. FIG. 3 illustrates a signal wave form when a periodic input signal IN is applied. As mentioned above, the conventional RC delay circuit generates the output signal OUT having a predetermined delay time to each cycle of the periodic input signal IN. Ideally, the output signal OUT has the same delay time in each cycle. However, when the periodic input signal IN is charged to the MOS capacitor 12 through the inverter IN1 and the resistor R, a second cycle of the input signal IN may be inputted to the MOS capacitor 12 when a first cycle of the input signal IN is not fully charged in the capacitor 12. In that case, the level of the output signal B of the RC delay unit 10 decreases and accordingly the delay time d2 of the output signal OUT is reduced. Thus, the delay time d2 of the second cycle becomes shorter than the delay time d1 of the first cycle.

As described above, the conventional RC delay circuit has a problem that the periodic input signal IN is applied, the RC delay time of each cycle may not be identical. Accordingly, the semiconductor memory device can not maintain the time margin of the signals due to the unstable RC delay operation.

SUMMARY OF THE INVENTION

Accordingly, the present invention is directed to a RC delay time stabilizing circuit which obviates the problems and disadvantages due to the conventional art.

An object of the present invention is to provide a RC delay time stabilizing circuit that maintains a stable RC delay operation.

To achieve these and other advantages and in accordance with the purpose of the present invention, as embodied and broadly described, there is provided a RC delay time stabilizing circuit which includes an inverter which inverts an input signal, a RC delay unit which is charged/discharged in accordance with an output from the inverter, a pull-up MOS transistor connected between a source voltage terminal and an output terminal of the RC delay unit and having a gate for receiving the input signal, and an output unit which generates an output signal having an identical delay time in accordance with output levels of the inverter and the RC delay unit.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
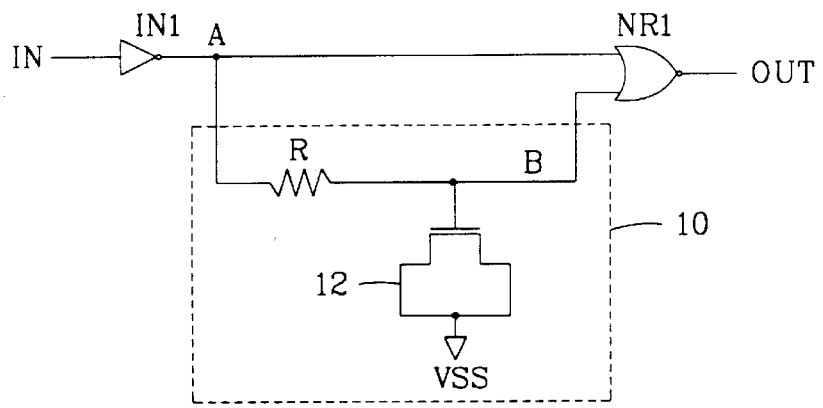
FIG. 1 is a diagram of a conventional RC delay circuit.
Figure 2:
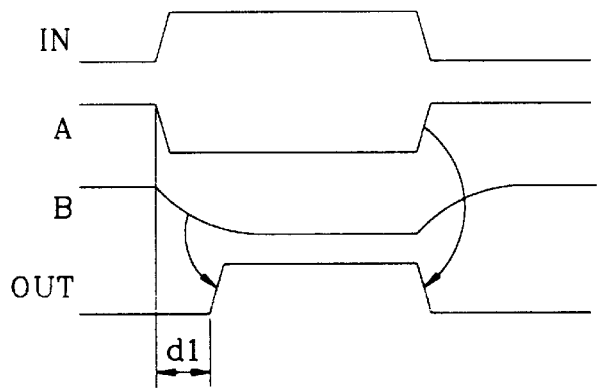
FIG. 2 is a signal wave-form diagram of each unit when a single-cycle input signal is inputted in FIG. 1.
Figure 3:
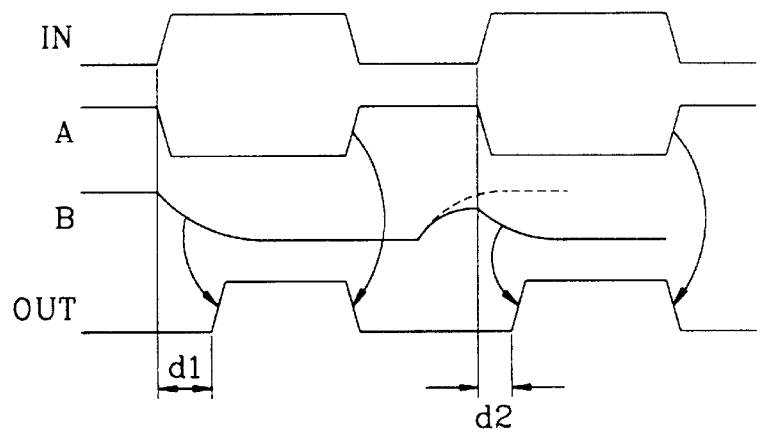
FIG. 3 is a signal wave-form diagram of each unit when a periodic input signal is inputted in FIG. 1.
Figure 4:
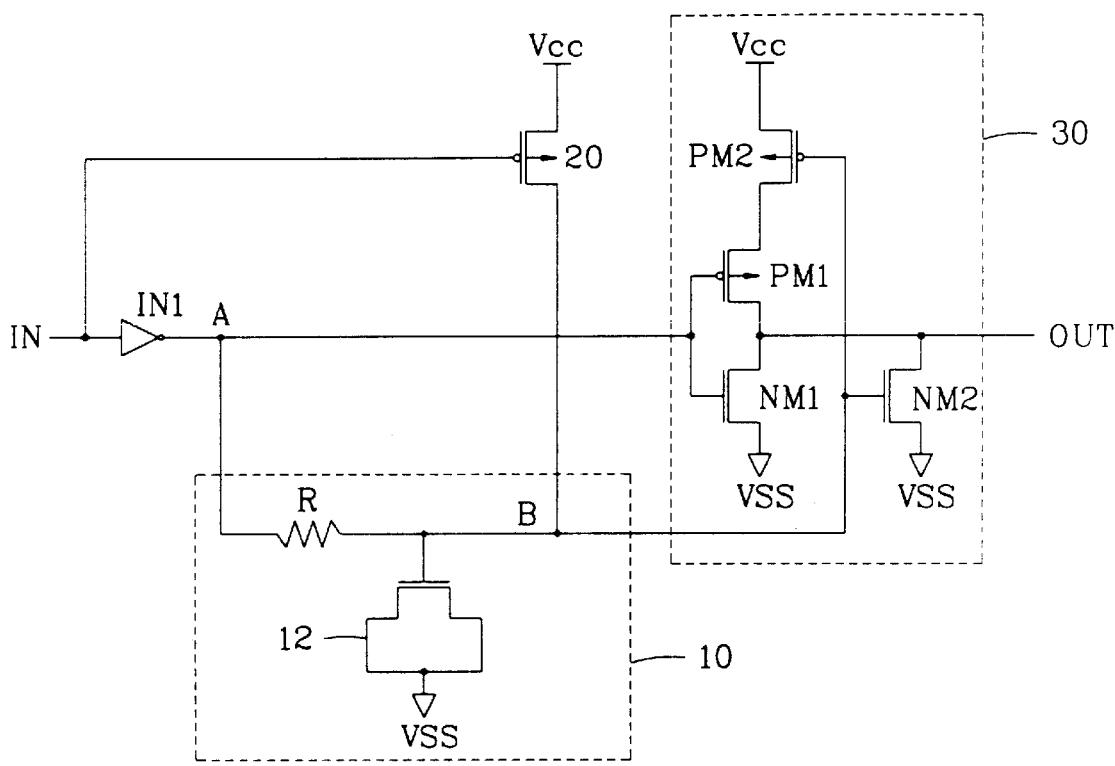
FIG. 4 is a diagram of a RC delay time stabilizing circuit according to the present invention.
Figure 5:
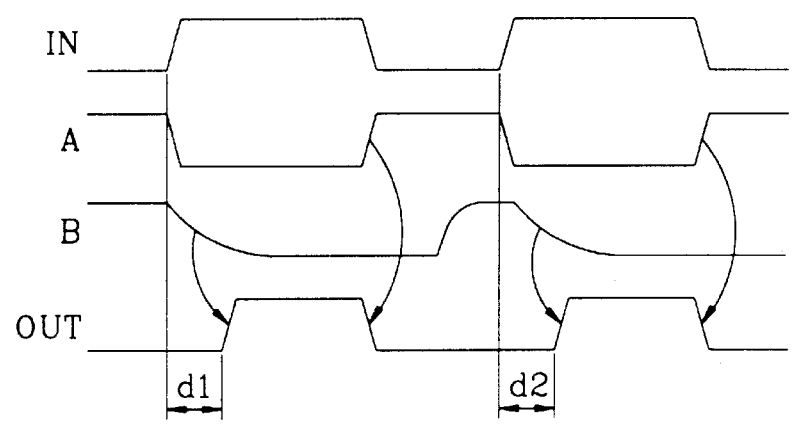
FIG. 5 is a signal wave-form diagram of each unit when a periodic input signal is inputted in FIG. 4.

FIG. 4 illustrates a RC delay time stabilizing circuit according to the present invention.

As shown therein, the RC delay time stabilizing circuit of the present invention is provided with an inverter IN1 inverting an input signal IN, a RC delay unit 10 delaying an output from the inverter IN1, a P-type MOS transistor 20 pulling up an output node B of the RC delay unit 10 in accordance with the input signal IN and an output unit 30 receiving outputs from the inverter IN1 and the RC delay unit 10 and outputting an output signal OUT which uniformly has a RC delay time, the RC delay unit 10 consisting of a resistor R and an N-type MOS capacitor 12 and the MOS transistor 20 being connected between a source voltage Vcc node and an output node B of the RC delay unit 10.

More specifically, the output unit 30 consists of MOS transistors PM2, PM1, NM1 which are serially connected between a source voltage Vcc and a ground voltage Vss, and a MOS transistor NM2 which is connected in parallel to drains of the MOS transistors PM1, NM1 and an output terminal thereof. Further, gates of the MOS transistors PM1, NM1 are connected with an output terminal of the inverter IN1, and gates of the MOS transistors PM2, NM2 are respectively connected with an output terminal of the RC delay unit 10. Here, it is noted that the MOS transistors PM1, PM2 are a P-type, while the MOS transistors NM1, NM2 are an N-type.

In such RC delay time stabilizing circuit according to the present invention, when then periodic input signal IN is inputted to the MOS capacitor 12 through the inverter IN1 and the resistor R, the MOS capacitor 12 of the RC delay unit 10 repeatedly performs charging and discharging in accordance with a level of the input signal IN, and the MOS transistor 20 pulls up the output terminal of the RC delay unit 10 in accordance with the input signal IN. Accordingly, the output unit 30 outputs the signal OUT having the same delay time in each cycle of the input signal IN in accordance with the signal A outputted from the inverter IN1 and the output signal B from the RC delay unit 10. More specifically, the operation of the circuit according to the embodiment of the present invention will be described as an example of first and second cycles of the input signal IN.

When the input signal IN in the first cycle is transited from a low level to a high level, the MOS transistor 20 is turned off and the output signal A of the inverter IN1 becomes the low level. Accordingly, the MOS transistor PM1 of the output unit 30 is turned on by the output signal A at the low level and at this time the MOS capacitor 12 starts to be discharged. Thus, the output signal B of the RC delay unit 10 decreases due to the discharge of the MOS capacitor 12. Then, when the output signal B decreases to the level of a threshold voltage of the MOS transistor PM2, the MOS transistor PM2 is turned on and accordingly the output signal OUT having the delay time of d1 with respect to the input signal IN is outputted through the MOS transistors PM2, PM1 which have been turned on and the output terminal of the output unit 30. Here, the delay time d1 is counted from the point where the input signal IN is transited from the low level to the high level to the point where the MOS transistor PM2 is turned on. Next, when the input signal IN is again transited from the high level to the low level, the MOS transistor NM1 is turned on by the output signal A from the inverter IN1 and the MOS capacitor 12 again starts to be charged. While, since the MOS transistor 20 has been already turned on by the input signal IN at the low level, the output node B of the RC delay unit 10 is pulled up by the turned-on MOS transistor 20. As a result, the output node B is charged by the charging operation of the MOS capacitor 12 and the pull-up of the MOS transistor 20, thereby decreasing the overall charging time.

Thus, when the input signal IN is transited to the high level from the low level in the second cycle, the delay time d2 of the output signal OUT in the second cycle is the same as the delay time d1 thereof in the first cycle since the output node B has been fully charged.

As described above, the RC delay time stabilizing circuit of the present invention decreases the charging time of the RC delay unit when the periodic signal is inputted, thus maintaining the same delay time in each cycle of the input signal.

It will be apparent to those skilled in the art that various modifications and variations can be made in the RC delay time stabilizing circuit of the present invention without departing from the spirit or scope of the invention. Thus, it is intended that the present invention cover the modifications and variations of this invention provided they come within the scope of the appended claims and their equivalents.

What is claimed is:

1. A RC delay time stabilizing circuit, comprising:
   an inverter inverting a periodic input signal;
   a RC delay unit being charged/discharged in accordance with an output from the inverter;
   a pull-up MOS transistor connected between a source voltage terminal and an output terminal of the RC delay unit and having a gate for receiving the input signal; and
   an output unit that generates an output signal which has a substantially uniform delay time relative to the periodic input signal in accordance with output levels of the inverter and the RC delay unit, wherein the output unit comprises,
   first to third MOS transistors serially connected between a first prescribed voltage and a second prescribed voltage, and
   a fourth MOS transistor connected in parallel to drains of the second and third MOS transistors and to an output terminal of the output unit, wherein gates of the first and fourth MOS transistors are connected with the output terminal of the RC delay unit.

2. The RC delay time stabilizing circuit according to claim 1, wherein the pull-up MOS transistor is a p-type.

3. The RC delay time stabilizing circuit according to claim 1, wherein the pull-up MOS transistor pulls up an output from the RC delay unit when the input signal is transited from a high level to a low level.

4. The RC delay time stabilizing circuit according to claim 1, wherein the output unit is a logic gate.

5. The RC delay time stabilizing circuit according to claim 1, wherein the first prescribed voltage is a source voltage and the second prescribed voltage is a ground voltage.

6. The RC delay time stabilizing circuit according to claim 5, wherein each of the first and second MOS transistors is a p-type and each of the third and fourth MOS transistors is an n-type.

7. A RC delay time stabilizing circuit, comprising:
   an inverter that inverts periodic input signals;
   a RC delay unit coupled to an output terminal on the inverter;
   a pull-up device connected between a first prescribed voltage and an output terminal of the RC delay unit, wherein the pull-up device receives the periodic input signals and pulls up the output terminal of the RC delay unit responsive to a prescribed transition of the periodic input signals; and
   an output unit connected to the output terminal of the inverter and an output terminal of the RC delay unit, wherein the output unit generates output signals each having a substantially identical delay time from a corresponding one of the periodic input signals, and wherein the output unit comprises,
   a plurality of transistors connected in series between the first prescribed voltage and a second prescribed voltage, wherein an output terminal of the output unit is connected between two of the plurality of transistors, and
   an additional transistor having a first electrode coupled to the output terminal of the output unit, wherein a control electrode of the additional transistor is connected with the output terminal of the RC delay unit.

8. The RC delay time stabilizing circuit of claim 7, wherein the pull-up device is a P-type MOS transistor that has a control electrode coupled to receive the periodic input signals.

9. The RC delay time stabilizing circuit of claim 7, wherein the output unit comprises:
   a pair of series coupled transistors having second electrodes coupled together, wherein the pair of transistors is connected between the output terminal of the inverter and an output terminal of the output unit.

10. The RC delay time stabilizing circuit of claim 9, wherein the output unit comprises:
    a second transistor connected between the first prescribed voltage and the pair of transistors, wherein the second transistor has a control electrode connected to the output terminal of the RC delay unit.

11. The RC delay time stabilizing circuit of claim 7, wherein the plurality of transistors are first to third MOS transistors, wherein second electrodes of the second and third MOS transistors are connected together and to the output terminal of the output unit, wherein the control electrode of the first MOS transistor is connected with the output terminal of the RC delay unit, wherein the first and second MOS transistors are a P-type and the third MOS transistor and the additional transistor are an N-type, and wherein the first and second prescribed voltages are a source voltage and a ground voltage.

12. A RC delay time stabilizing circuit, comprising:
   a logic gate logically processing periodic input signals;
   a RC delay unit being charged/discharged in accordance with the logically processed periodic input signals from the logic gate; and
   an output unit coupled to the logic gate and the RC delay unit that outputs delayed signals at an output terminal, each having a substantially identical delay time relative to a corresponding one of the periodic input signals, wherein the output unit comprises,
   first to third MOS transistors serially connected between a source voltage and a ground voltage; and
   a fourth MOS transistor connected in parallel to drains of the second and third MOS transistors and to the output terminal of the output unit, wherein gates of the first and fourth MOS transistors are connected with an output terminal of the RC delay unit.

13. The RC delay time stabilizing circuit of claim 12, further comprising a pull-up device connected between a source voltage terminal and the output terminal of the RC delay unit, wherein the pull-up device pulls up the output terminal of the RC delay unit responsive to a prescribed transition of the input signal.

14. The RC delay time stabilizing circuit of claim 12, wherein the first and second transistors are P-type MOS transistors, wherein the third and fourth transistors are N-type transistors.

* * * * *